United States Patent
Rambosek et al.

(10) Patent No.: US 7,549,875 B2
(45) Date of Patent: Jun. 23, 2009

(54) SWIVEL CAP FOR FLASH MEMORY DEVICE

(75) Inventors: G. Phillip Rambosek, Shafer, MN (US);
Robert C. Martin, St. Paul, MN (US);
Allen Zadeh, New York, NY (US); Boris Kontorovich, Brooklyn, NY (US);
Richard Whitehall, New York, NY (US)

(73) Assignee: Imation Corp., Oakdale, MN (US)

( * ) Notice: Subject to any disclaimer, the term of this patent is extended or adjusted under 35 U.S.C. 154(b) by 496 days.

(21) Appl. No.: 11/229,358

(22) Filed: Sep. 16, 2005

(65) Prior Publication Data

US 2007/0063249 A1    Mar. 22, 2007

(51) Int. Cl.
*H01R 13/44* (2006.01)
(52) U.S. Cl. ...................... 439/136; 220/810
(58) Field of Classification Search ............... 439/131, 439/135, 136; 220/811–813, 810, 345.1, 220/351
See application file for complete search history.

(56) References Cited

U.S. PATENT DOCUMENTS

| | | | | |
|---|---|---|---|---|
| 5,141,354 A | * | 8/1992 | Morsbach | ............ 403/322.4 |
| 6,522,534 B1 | * | 2/2003 | Wu | ............ 361/686 |
| D492,307 S | | 6/2004 | Aqqad et al. | |
| D493,790 S | | 8/2004 | Wu | |
| D494,969 S | | 8/2004 | Lin | |
| 6,808,400 B2 | | 10/2004 | Tu | |
| 6,926,544 B2 | | 8/2005 | Lee | |
| 6,932,629 B2 | * | 8/2005 | Ikenoue | ............ 439/138 |
| 7,295,431 B2 | * | 11/2007 | Chuang | ............ 361/683 |
| 2002/0025717 A1 | * | 2/2002 | Balzano | ............ 439/489 |

OTHER PUBLICATIONS

U.S. Appl. No. 29/238,576, filed Sep. 16, 2005, G. Phillip Rambosek et al., entitled "Flash Memory Device including Swivel Cap".

* cited by examiner

*Primary Examiner*—Tho D Ta
*Assistant Examiner*—Travis Chambers
(74) *Attorney, Agent, or Firm*—Eric D. Levinson

(57) ABSTRACT

A flash memory device is disclosed. The flash memory device includes a housing enclosing a memory board, a serial port extending from the housing and electrically coupled to the memory board, and a swivel cap rotatably coupled and removably attached to the housing. In this regard, the swivel cap is rotatable between a closed position covering the serial port and an open position exposing the serial port, and the swivel cap is rotatable to at least one removal position enabling a separation of the swivel cap from the housing.

26 Claims, 13 Drawing Sheets

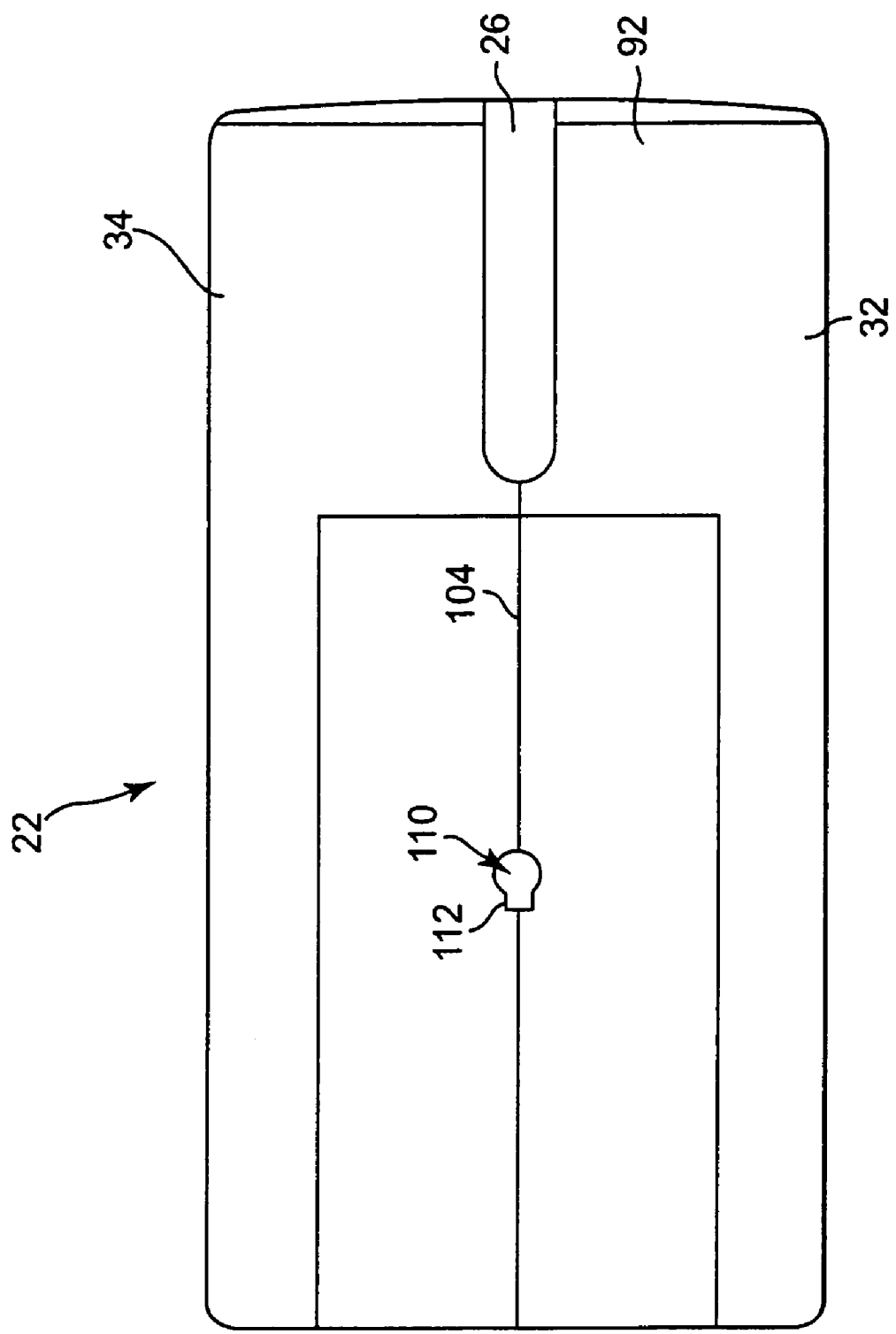

SWIVEL CAP FOR FLASH MEMORY DEVICE

THE FIELD OF THE INVENTION

The present invention generally relates to caps for flash memory devices, and more particularly, the present invention relates to swivel caps that are rotatably and removably attachable to flash memory devices.

BACKGROUND

Flash memory devices are broadly popular and have received wide approval from consumers with an interest in storing nonvolatile electronic data for subsequent retrieval and use.

A flash memory device is generally smaller than a deck of cards, and is thus well suited for portability between computers and other peripheral electronic devices. A flash memory device generally includes a housing enclosing a memory assembly, a serial port coupled to the memory assembly and extending from the housing, and a cap to cover/protect the serial port when the device is not in use. The memory assembly includes some form of a memory board including a memory chip, and is often referred to a flash memory.

In this regard, a flash memory is a nonvolatile semiconductor memory, also known as flash Random Access Memory (RAM). One embodiment of a flash memory is an Electrically Erasable Programmable Read Only Memory (EEPROM). In general, however, the flash memory is erasable and modifiable at the block level, unlike most EEPROM memories, which are erasable and modified at the byte level. To this end, flash memory that is modifiable at the block level is characterized by high performance and high-speed data collection and retrieval. With the above in mind, flash memories have been beneficially employed as portable memory in a variety of applications, including digital cellular phones, digital cameras, local area networks switching, personal computer cards, and controllers for notebook computers.

Flash memory devices have met with broad approval and acceptance, and are used in multiple electronic applications. Because flash memory devices are lightweight and highly portable, damage to data/serial ports extending from the flash memory device housing is possible.

With this in mind, some known flash memory devices include a removable cap. The removable cap can be fitted over the data/serial port of the flash memory device when the flash memory device is not in use. When the flash memory device is in use, the cap is removed for access to the serial port. Removal of the cap can create wear on the cap surfaces that engage with the housing. Over time, it is possible that a cap will wear and no longer be suitable for use (i.e., the cap falls off of the housing). In addition, removing the cap for use creates a risk of misplacing the cap, thus reducing the value of the device.

Flash memory devices have become widely popular due to the high speed of data collection and retrieval, and their high portability. However, the portability of flash memory devices necessitates a cap or other protector to cover the serial port of the flash memory device. In this regard, there is a need for an improved cap for flash memory devices.

SUMMARY

One aspect of the present invention relates to a flash memory device. The flash memory device includes a housing enclosing a memory assembly, a serial port extending from the housing and coupled to the memory assembly, and a swivel cap rotatably coupled and removably attached to the housing. In this regard, the swivel cap is rotatable between a closed position covering the serial port and an open position exposing the serial port, and the swivel cap is rotatable to at least one removal position enabling a separation of the swivel cap from the housing.

Another aspect of the present invention relates to a swivel cap removably attachable to a flash memory device. The swivel cap includes a cap end, a pair of opposing flanges cantilevered from the cap end, and a pivot post extending from an interior surface of each of the opposing flanges. In this regard, each pivot post terminates in a keyed head.

Yet another aspect of the present invention relates to a method of removing a cap from a flash memory device. The method includes providing a flash memory device including a housing and a rotatable swivel cap coupled to opposing pivot holes of the housing. The method additionally provides rotating the swivel cap to a first removal position and removing a first swivel cap flange from the housing. The method further provides rotating the swivel cap to a second removal position and removing a last swivel cap flange from the housing.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 4 illustrates a bottom planar view of a housing of a flash memory device according to one embodiment of the present invention;

DETAILED DESCRIPTION

Figure 1:
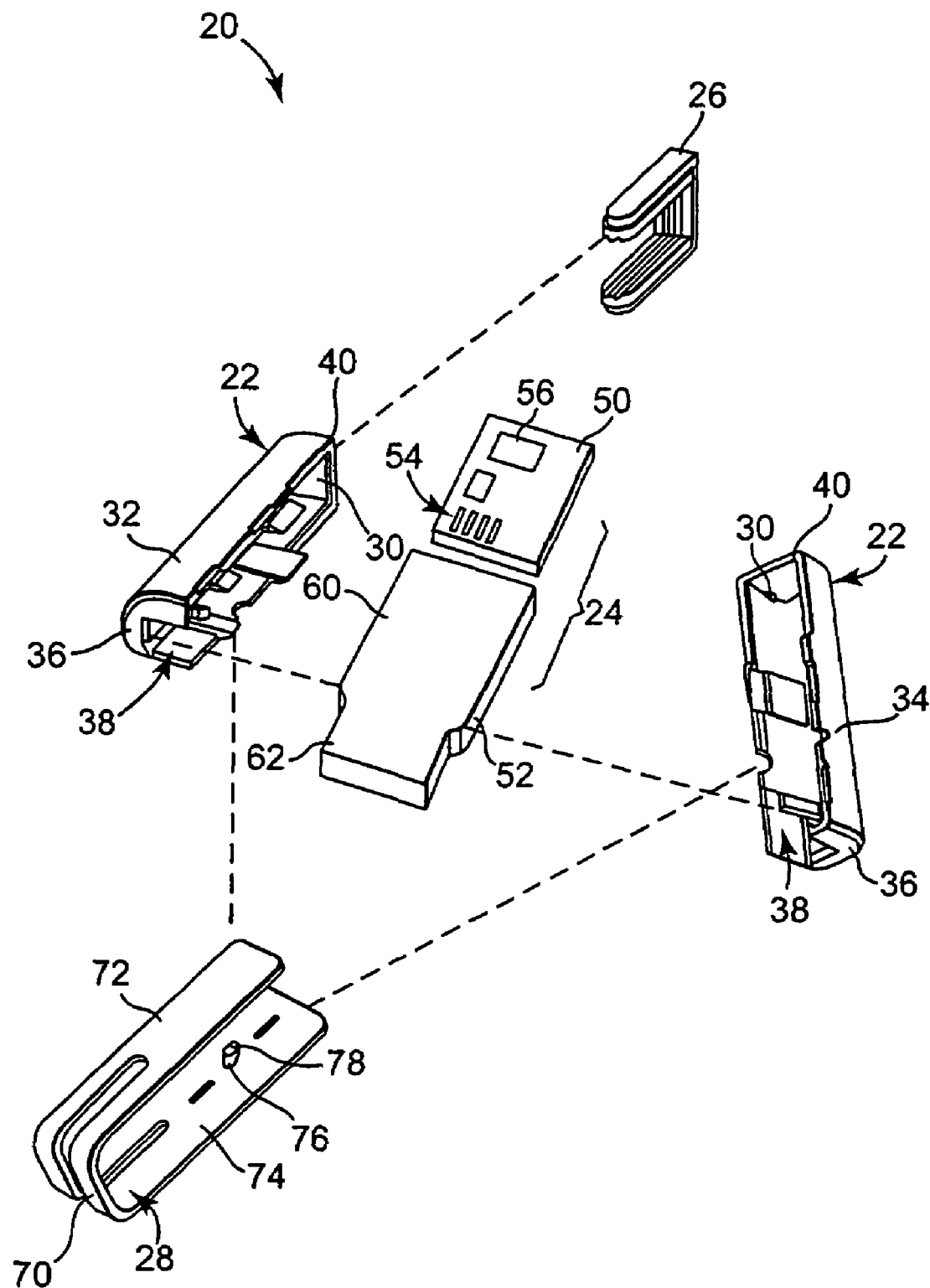
FIG. 1 illustrates an exploded view of a flash memory device including a swivel cap according to one embodiment of the present invention.

FIG. 1 illustrates an exploded view of a flash memory device 20 according to one embodiment of the present invention. The flash memory device 20 includes a housing 22 enclosing a memory assembly 24, a light pipe 26 coupleable to the housing 22, and a swivel cap 28 rotatably and removably coupled to the housing 22.

The housing 22 generally encloses the memory assembly 24, and when assembled, defines an enclosed region 30. In one embodiment, the housing includes a first housing section 32 and a second housing section 34. In this regard, the first housing section 32 and the second housing section 34 combine to define the housing 22 and the enclosed region 30. In one embodiment, the first housing section 32 defines a left side, and the second housing section 34 defines a right side of the housing 22. In another embodiment, two housing sections form a top half and a bottom half that combine to form the housing. As used throughout the Specification, directional terminology such as "left side," "right side," "upper," "lower," "top," "bottom," etc., is employed for purposes of illustration only and is in no way limiting.

The first and second housing sections 32, 34, respectively, are sized to be reciprocally mated to one another and are generally rectangular, except for a port side 36 that defines a window 38. In this regard, the window 38 is sized to receive a portion of the memory assembly 24.

In addition to forming a window 38, the first and second housing sections 32, 34 form a relief 40 sized to receive the light pipe 26. Thus, when assembled, the housing 22 encloses the memory assembly 24 such that the first housing section 32 is on one side of the light pipe 26 and the second housing section 34 is on an opposite side of the light pipe 26. In this manner, the light pipe, translucent in one embodiment, is visible from multiple angles to indicate to a user an "on" or operable enabling of the memory assembly 24. In one embodiment, the light pipe 26 is formed of a translucent polymer, for example polypropylene. In other embodiments, the light pipe 26 is formed of a translucent polyolefin, although other translucent polymers are also acceptable.

In one embodiment, the housing 22 is formed of a polymer, such as an acrylonitrile butadiene styrene (ABS), a polypropylene or polyethylene or other polyolefin, a polyester, a nylon, or other suitable plastic.

The memory assembly 24 includes a printed circuit board 50 and a case 52. In one embodiment, the printed circuit board (PCB) 50 includes data pads 54 and a memory chip 56 electrically coupled to the data pads 54. In general, the PCB 50 is configured to store retrievable electronic data for subsequent retrieval and use.

The case 52 is generally sized to enclose the PCB 50. In this regard, the case 52 includes a base 60 and a data port 62 extending from the base 60. When assembled, the data pads 54 of the PCB 50 are disposed adjacent to the data port 62 of the memory assembly 24. As illustrated, the data port 62 extends from the housing 22 (when assembled) for access with peripheral electronic devices.

In another embodiment, the memory assembly includes a printed circuit board and a data port coupled about data pads on the a printed circuit board.

The swivel cap 28 defines a cap end 70, and a pair of opposing flanges 72, 74 cantilevered from and extending from the cap end 70. In one embodiment, at least one of the flanges 72, 74 include a pivot post 76 extending from the flange and a keyed head 78 extending from the pivot post 76. When assembled, the swivel cap 28 is rotatable between a fully closed position covering the data port 62 and a fully open position exposing the data port 62, and the swivel cap 28 is rotatable to at least one removal position enabling a separation of the swivel cap 28 from the housing 22.

In one embodiment, the swivel cap 28 is formed of a polymer, such as an acrylonitrile butadiene styrene (ABS), a polypropylene or polyethylene or other polyolefin, a polyester, a nylon, or other suitable plastic.

Figure 2:
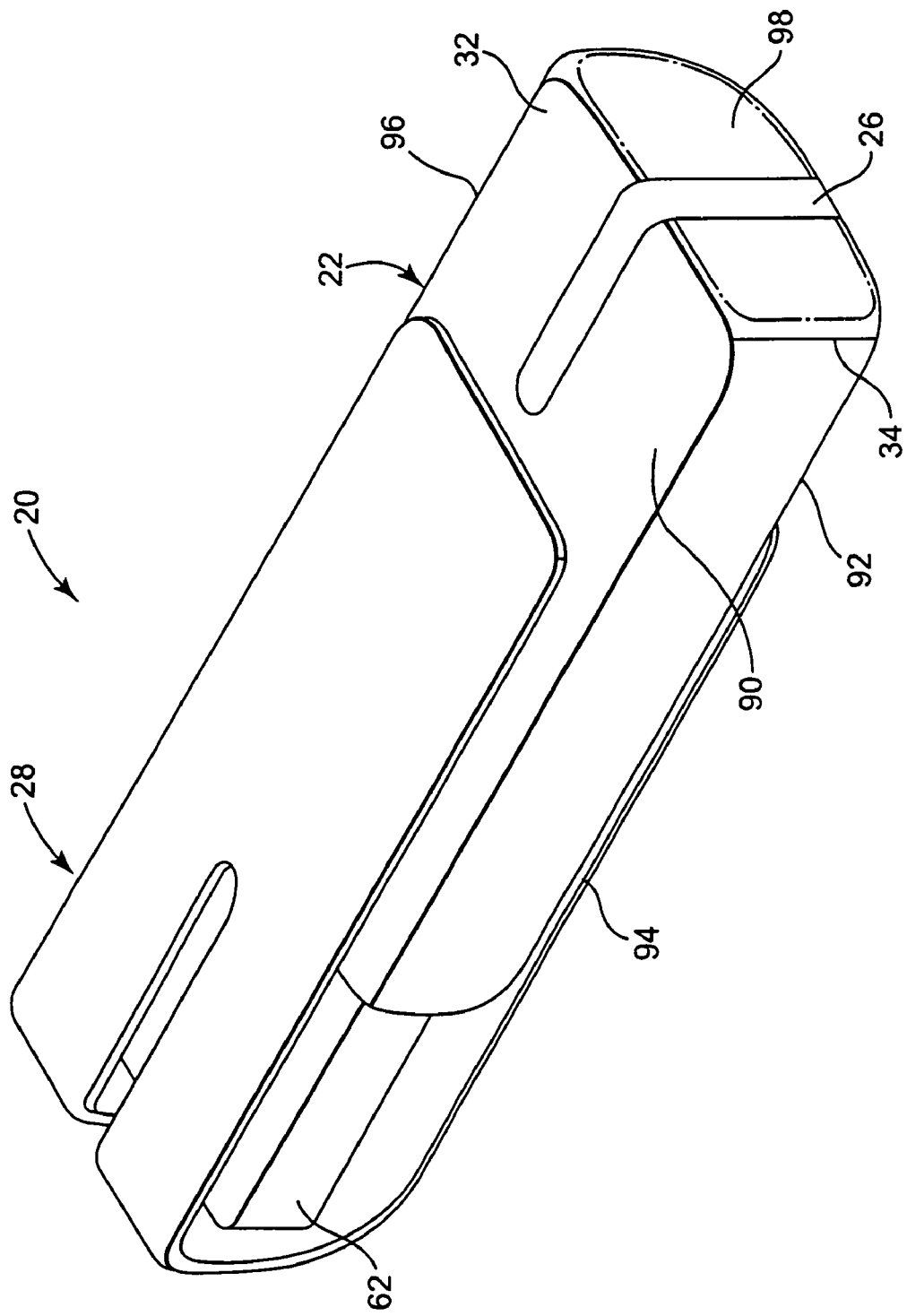
FIG. 2 illustrates a perspective top view of a flash memory device including a swivel cap in a closed position according to one embodiment of the present invention.

FIG. 2 illustrates a top perspective view of the flash memory device 20 assembled to show the swivel cap 28 in a closed position and coupled to the housing 22 according to one embodiment of the present invention. As a point of reference, the orientation of the flash memory device 20 illustrated in FIG. 2 is inverted from the orientation of the flash memory device 20 illustrated in FIG. 1. In this regard, the first housing section 32 is in the far field, and the second housing section 34 is in the near field of the view illustrated in FIG. 2. In any regard, the swivel cap 28 is deployed to the fully closed position and covers the data port 62.

The housing 22, when assembled, defines a first face 90 opposite a second face 92 extending between opposing sides 94, 96, and a base 98 opposite the data port 62. In this regard, the light pipe 26 is disposed on the base 98 end of the housing 22, and wraps around the faces 90, 92, such that the light pipe 26 is visible in multiple orientations of the device 20.

In one embodiment, the first face 90 is substantially planar, or flat, and the second face 92 defines a curvature between the sides 94, 96. In this manner, a user is able to feel, or sense, an orientation of the device 20, even without looking at the device 20.

Figure 3:
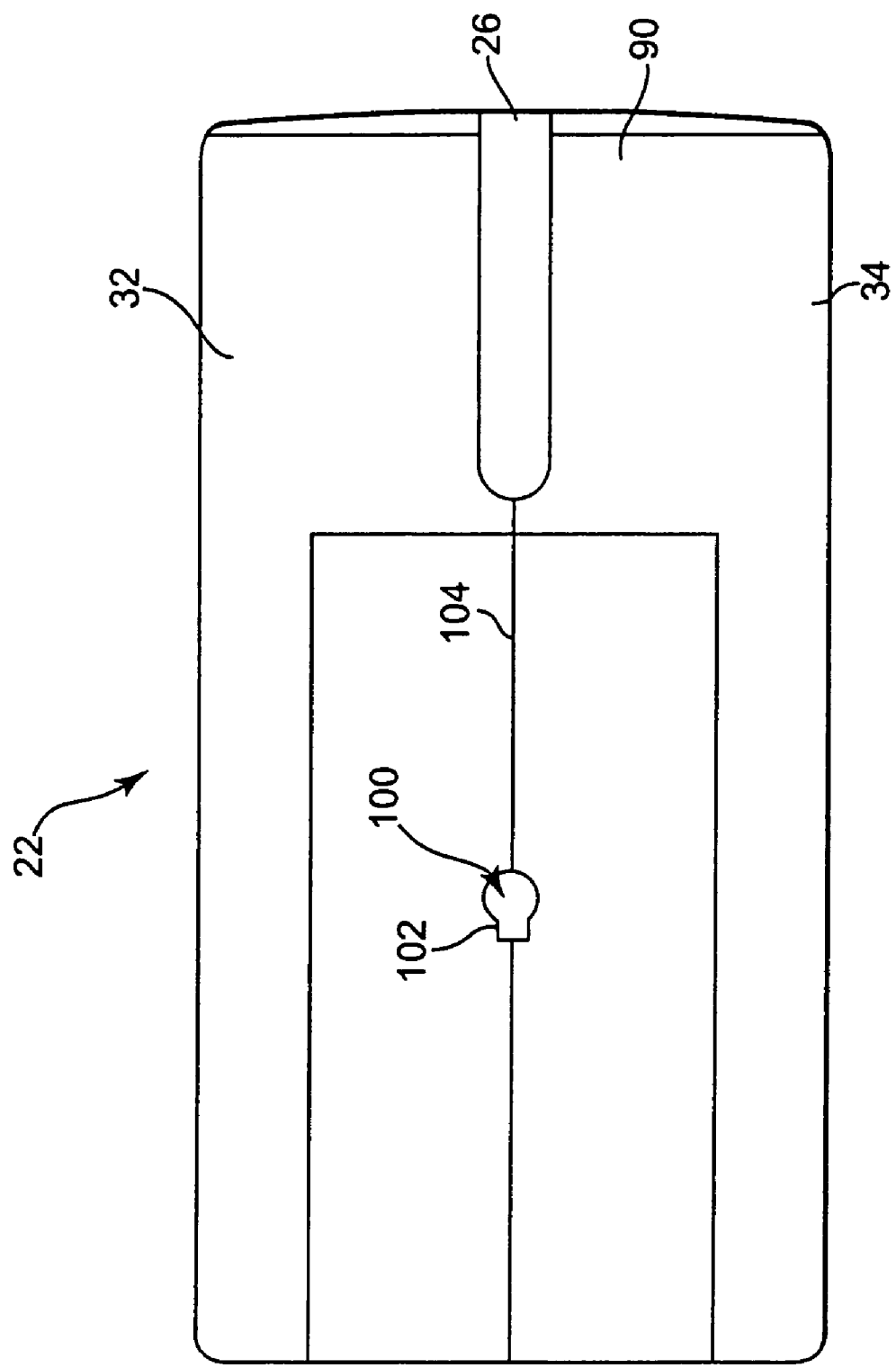
FIG. 3 illustrates a top planar view of a housing of a flash memory device according to one embodiment of the present invention.

FIG. 3 illustrates a top planar view of the face 90 of the housing 22. The face 90 defines a pivot hole 100 and a keyed channel 102 communicating with the pivot hole 100. In one embodiment, the first housing section 32 and the second housing section 34 assemble about a part line 104 that forms a central access of the housing 22. In this regard, the pivot hole 100 is formed about the part line 104 of the housing 22, although other locations for the pivot hole 100 are also acceptable (for example, when the housing is formed as a "top" and "bottom," the pivot hole is not located on a part line). As illustrated, the keyed channel 102 includes an orientation that is illustrated as aligned along the part line 104 of the housing 22. In other embodiments, the keyed channel 102 is formed in the housing 22 in orientations that are not aligned with the part line 104.

FIG. 4 illustrates a bottom planar view of the face 92 of the housing 22. As a point of reference, the face 92 illustrated in FIG. 4 depicts a 180-degree rotation of the view illustrated in FIG. 3. In this regard, the first housing section 32 and the second housing section 34 have been rotated by 180 degrees also. In any regard, the part line 104 separates the first housing section 32 from the second housing section 34. The face 92 defines a pivot hole 110 and a keyed channel 112 communicating with the pivot hole 110. In one embodiment, the pivot hole 110 and the keyed channel 112 are mirror images of the pivot hole 100 (FIG. 3) and the keyed channel 102 (FIG. 3). In other embodiments, the pivot hole 110 and the keyed channel 112 define a directional orientation that is different than the pivot hole 100 and the keyed channel 102 formed on the face 90.

Aspects of the present invention provide for a variety of geometries for the keyed channels formed in the housing 22. Thus, as described above, each of the faces 90, 92 can define different keyed channels including a variety of orientations for the keyed channels. With this in mind, FIGS. 5A-5C illustrate exemplary embodiments of keyed channels defined by housing faces according to the present invention.

Figure 5A:
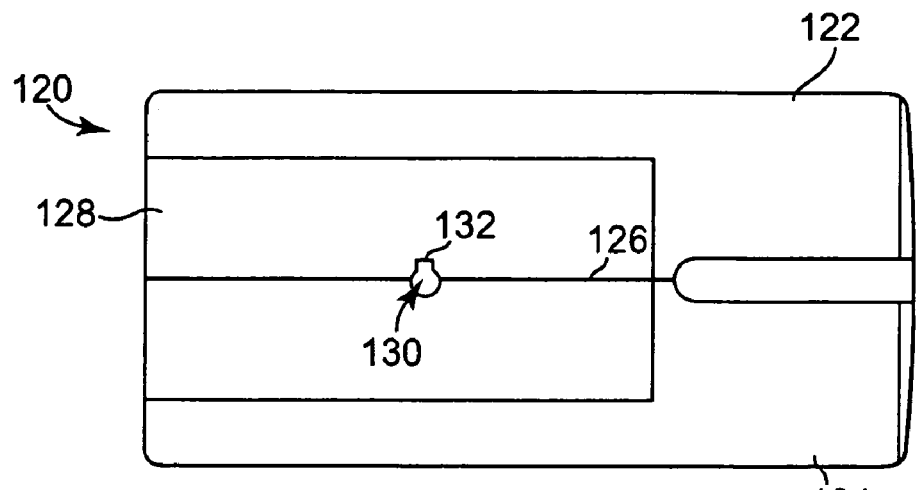
FIG. 5A illustrates a bottom planar view of another embodiment of a housing of a flash memory device according to the present invention.

FIG. 5A illustrates a housing 120 according to one embodiment of the present invention. The housing 120 includes a first housing section 122 and a second housing section 124 coupled along a part line 126. As oriented, FIG. 5A illustrates a bottom planar view of a face 128 of the housing 120. The face 128 defines a pivot hole 130 and a keyed channel 132. In one embodiment, the keyed channel 132 is oriented such that the swivel cap 28 (FIG. 1) is removable from the housing 120 when the swivel cap 28 is rotated 90 degrees from the closed position (defined as covering the data port 62 in FIG. 1).

Figure 5B:
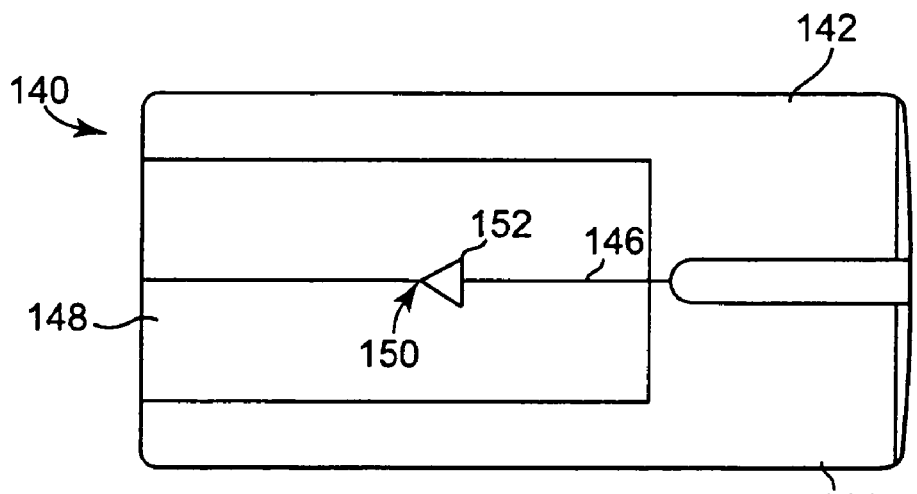
FIG. 5B illustrates a bottom planar view of another embodiment of a housing of a flash memory device according to the present invention.

FIG. 5B illustrates a housing 140 according to one embodiment of the present invention. The housing 140 includes a first housing section 142 and a second housing section 144 joined along a part line 146. In this manner, FIG. 5B illustrates a bottom planar view of a face 148 of the housing 140. The face 148 defines a triangular pivot hole 150 and a keyed channel 152 communicating with the pivot hole 150. In one embodiment, the keyed channel 152 defines an equilateral triangle. In other embodiments, the keyed channel 152 defines a non-equilateral triangle.

Figure 5C:
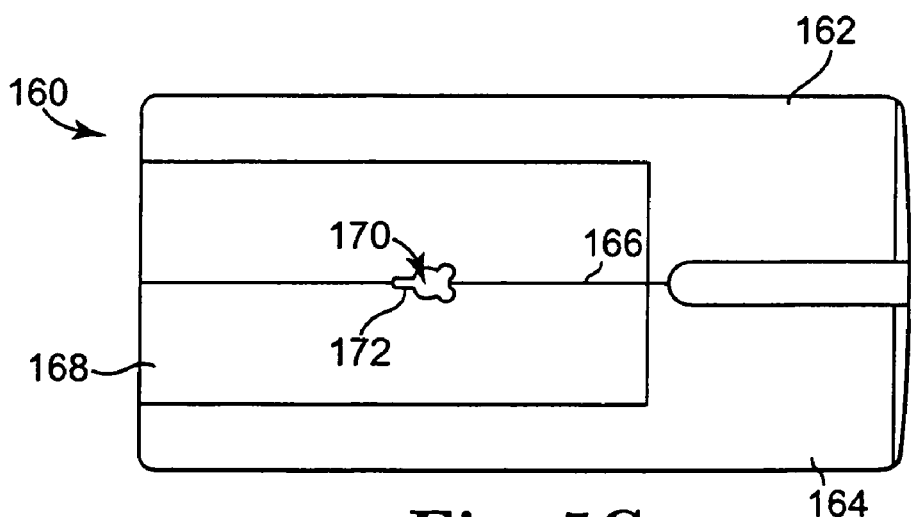
FIG. 5C illustrates a bottom planar view of another embodiment of a housing of a flash memory device according to the present invention.

FIG. 5C illustrates a housing 160 according to one embodiment of the present invention. The housing 160 includes a first housing section 162 and a second housing section 164 joined together along a part line 166. In this regard, FIG. 5C illustrates a bottom planar view of a face 168 of the housing 160. The face 168 defines a multi-lobed pivot hole 170 and a keyed channel 172 communicating with the pivot hole 170.

FIGS. 5A-5C illustrate various embodiments of pivots holes and keyed channels communicating with the pivot holes defining a variety of orientations. In this regard, FIGS. 5A-5C illustrate exemplary embodiments presented for purposes of illustration, but not intending to limit the formation or orientation of the pivot holes and the keyed channels. With this in mind, the pivot holes and keyed channels are preferably aligned along a part line of the housings 120, 140, 160 to simplify an assembly of the swivel cap 28 to the housing. In other words, other shapes, positions, and orientations of the keyed channels are also acceptable.

Figure 6:
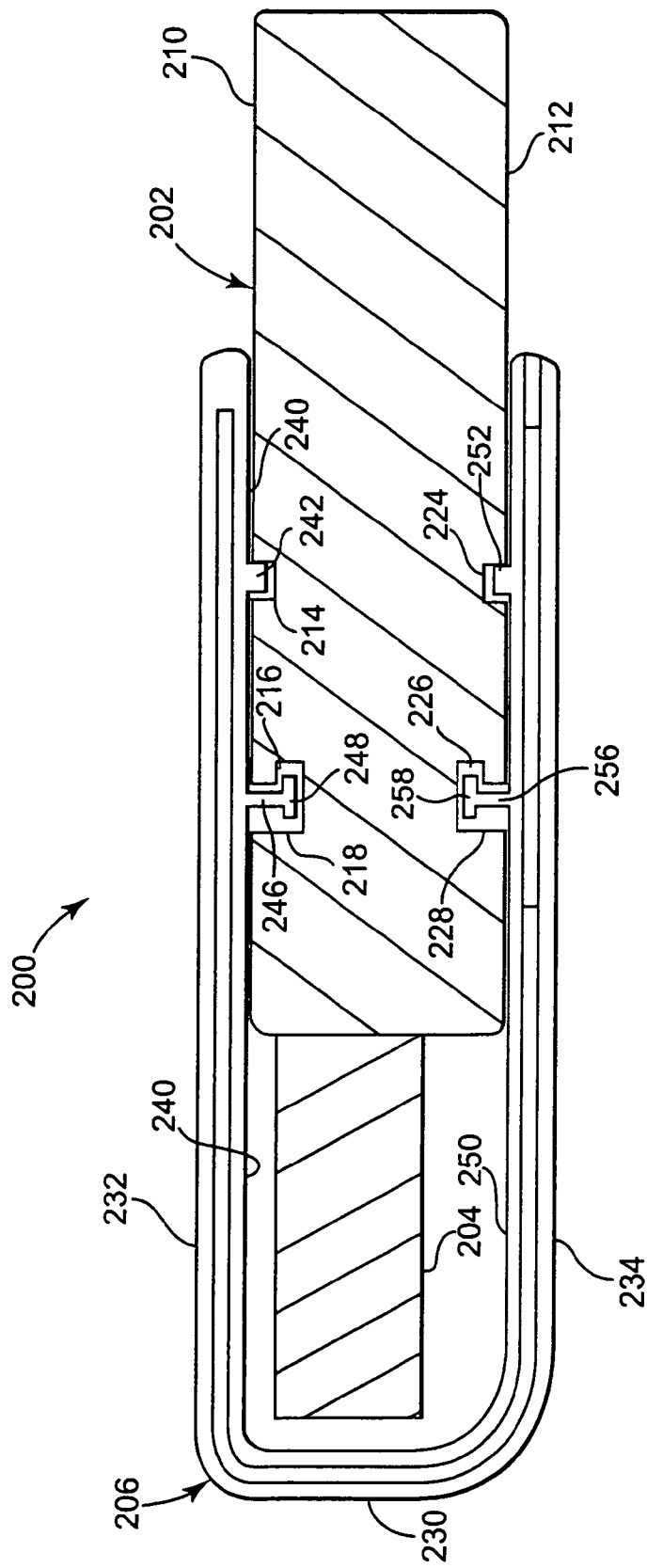
FIG. 6 illustrates an area cross-sectional view of the flash memory device illustrated in FIG. 2.

FIG. 6 illustrates a cross-sectional view of a flash memory device 200 according to one embodiment of the present invention. The flash memory device 200 includes a housing 202 enclosing a memory assembly (not shown), a serial port 204 extending from the housing 202, and a swivel cap 206 rotatably coupled and removably attached to the housing 202.

The housing 202 defines a first face 210 and a second face 212. In one embodiment, the first face 210 defines a recess 214, and a pivot hole 216 and a keyed channel 218 communicating with the pivot hole 216. In one embodiment, the second face 212 defines a recess 224, a pivot hole 226, and a keyed channel 228 that communicates with the pivot hole 226.

The swivel cap 206 defines a cap end 230, and a pair of opposing flanges 232, 234 cantilevered from the cap end 230. In one embodiment, the flange 232 defines an interior face 240, a detent 242 extending from the interior face 240, and a pivot post 246 extending from the interior face 240. The pivot post 246 terminates in a keyed head 248. In one embodiment, the keyed head extends beyond the pivot post (i.e., the keyed head is "mushroomed" beyond the pivot post). In a preferred embodiment, the keyed head defines a perimeter that is equal to a perimeter of the pivot post.

In one embodiment, the flange 234 defines an interior surface 250, a detent 252 extending from the interior face 250, and a pivot post 256 extending from the interior face 250. The pivot post 256 terminates in a keyed head 258.

As illustrated in FIG. 6, the swivel cap 206 is in a closed position covering and protecting the serial port 204. In the closed position, the recess 214 formed in the housing 202 captures the detent 242. In addition, the pivot post 246 is rotatably disposed in the pivot hole 216 such that the keyed head 248 is captured within the pivot hole 216 (i.e., the swivel cap 206 can not be removed in the position shown because the keyed head 248 is captured within the pivot hole 216). In particular, the keyed head 248 is not aligned with the keyed channel 218, such that the pivot post 246 rotates within the pivot hole 216, but the pivot post 246 and the keyed head 248 cannot be extracted from the pivot hole 216 in the orientation shown.

When the swivel cap 206 is in the closed position, the detent 252 is slidably captured in the recess 224, and the pivot post 256 is rotatably captured within the pivot hole 226. In the closed position, the keyed head 258 is not removably aligned with the keyed channel 228 such that the swivel cap 230 can be rotated about the housing 202 but is not removable, in one embodiment, when the cap 206 is in the illustrated closed position.

As a point of reference, while the housing forms the recesses 214, 224 and the swivel cap 206 forms the detents 242, 252, in another embodiment the housing forms at least one detent that is received by at least one recess formed in the swivel cap.

In one embodiment, the swivel cap 206 is a living spring. For example, the detents 242, 252 extending from the interior surfaces 240, 250, respectively, are captured within the recesses 214, 224, respectively, of the housing 202 such that a tension is formed between the swivel cap 206 and the housing 202 when the swivel cap 206 is in the closed position. In particular, at least one surface of the detents 242, 252 frictionally contacts a surface of the recesses 214, 224 to affect a tension between the swivel cap 206 and the housing 202.

In this regard, the swivel cap 206 defines a "spring constant" such that a displacement force of the swivel cap 206 relative to the housing 202 is proportional (by the spring constant) to the distance the swivel cap 206 is displaced. Thus, for a swivel cap 206 having a higher spring constant, the detents 242, 252 are more resistively maintained within the recesses 214, 224, respectively, such that more force is needed to swivel the cap 206 between the closed and open positions. In one embodiment, the detents 242, 252 and the recesses 214, 224 are selectively configured such that the swivel cap 206 is tensioned to the closed position and necessitate a certain threshold force applied to the swivel cap 206 to displace the swivel cap 206 to the open position. In this manner, the present invention provides a living spring swivel cap 206 protectively secured to the housing 202.

Figure 7:
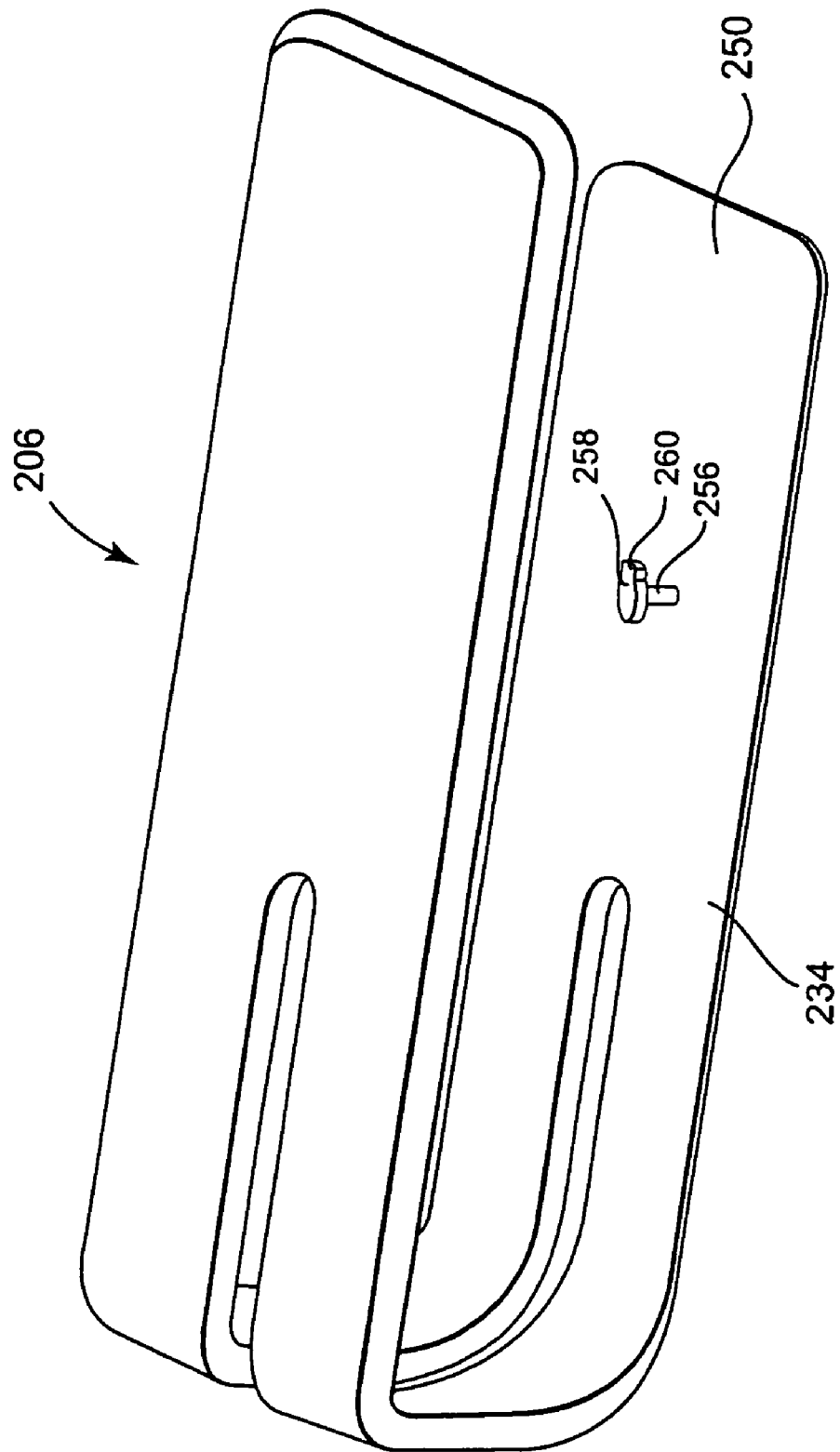
FIG. 7 illustrates a perspective view of a swivel cap including a pivot post and a keyed head extending from the pivot post according to one embodiment of present invention.

FIG. 7 illustrates a perspective view of the swivel cap 206 according to one embodiment of the present invention. The pivot post 256 extends away from the interior surface 250 of the flange 234. The pivot post 256 terminates in the keyed head 258. In one embodiment, the keyed head 258 defines a key 260 that includes a complimentary geometry to the keyed channel 228 (FIG. 6). In this manner, when the key 260 of the keyed head 256 is aligned in a removal position relative to the keyed channel 228, the flange 234 can be removed from the face 212 of the housing 202 (FIG. 6). Conversely, when the key 260 of the keyed head 256 is not aligned in the removal position relative to the keyed channel 228, the flange 234 cannot be removed from the face 212 of the housing 202, but rather rotates about the pivot hole 226 (FIG. 6).

Figure 8:
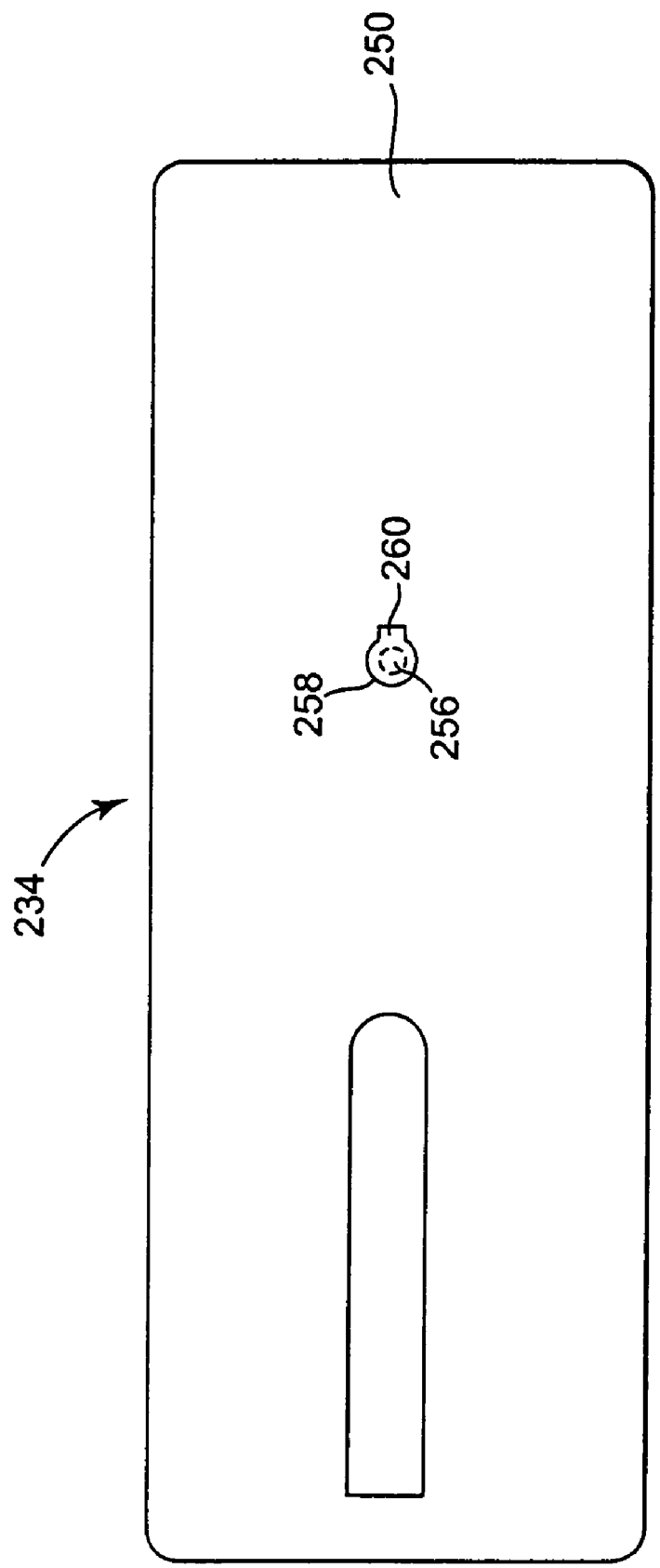
FIG. 8 illustrates a top view of the keyed head illustrated in FIG. 7.

FIG. 8 illustrates a top planar view of the interior surface 250 of the flange 234 according to one embodiment of the present invention. In one embodiment, the keyed head 258 extends beyond the pivot post 256, and the key 260 extends from the keyed head 258 beyond the pivot post 256, as illustrated.

Figure 9:
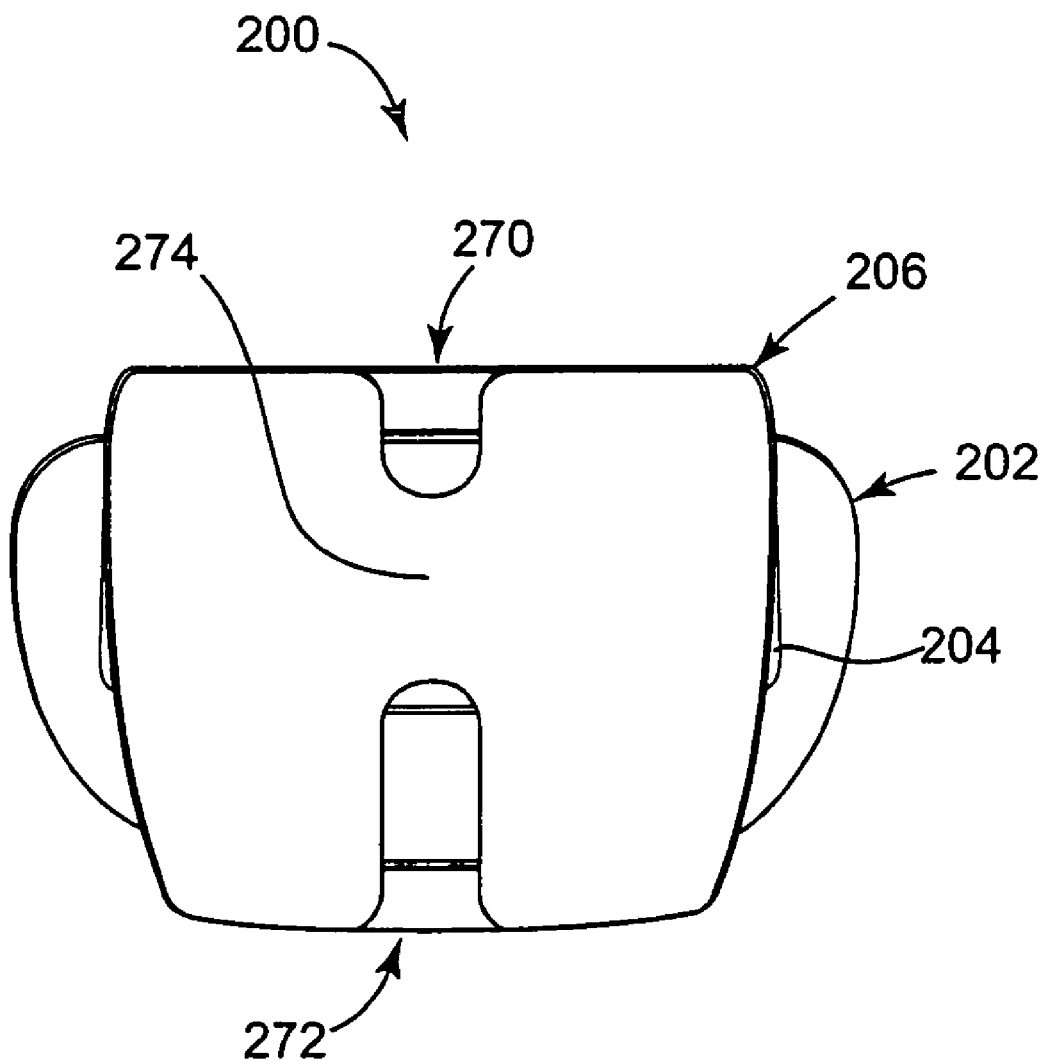
FIG. 9 illustrates a front-end view of the flash memory device illustrated in FIG. 2.

FIG. 9 illustrates a front view of the flash memory device 200 according to one embodiment of the present invention. In this orientation, the swivel cap 206 is in the closed position. The swivel cap 206 defines a first relief 270 and a second relief 272 smoothly bridged by a link 274. In one embodiment, the link 274 is suitable for attachment to an accessory such as a keychain, or a clip. In this manner, the swivel cap 206 via the link 274 provides a carrying mechanism in addition to a protective mechanism for covering the serial port 204. Thus, in one embodiment the link 274 forms a bridge/link suitable for attaching a lanyard to the swivel cap 206.

Figure 10A:
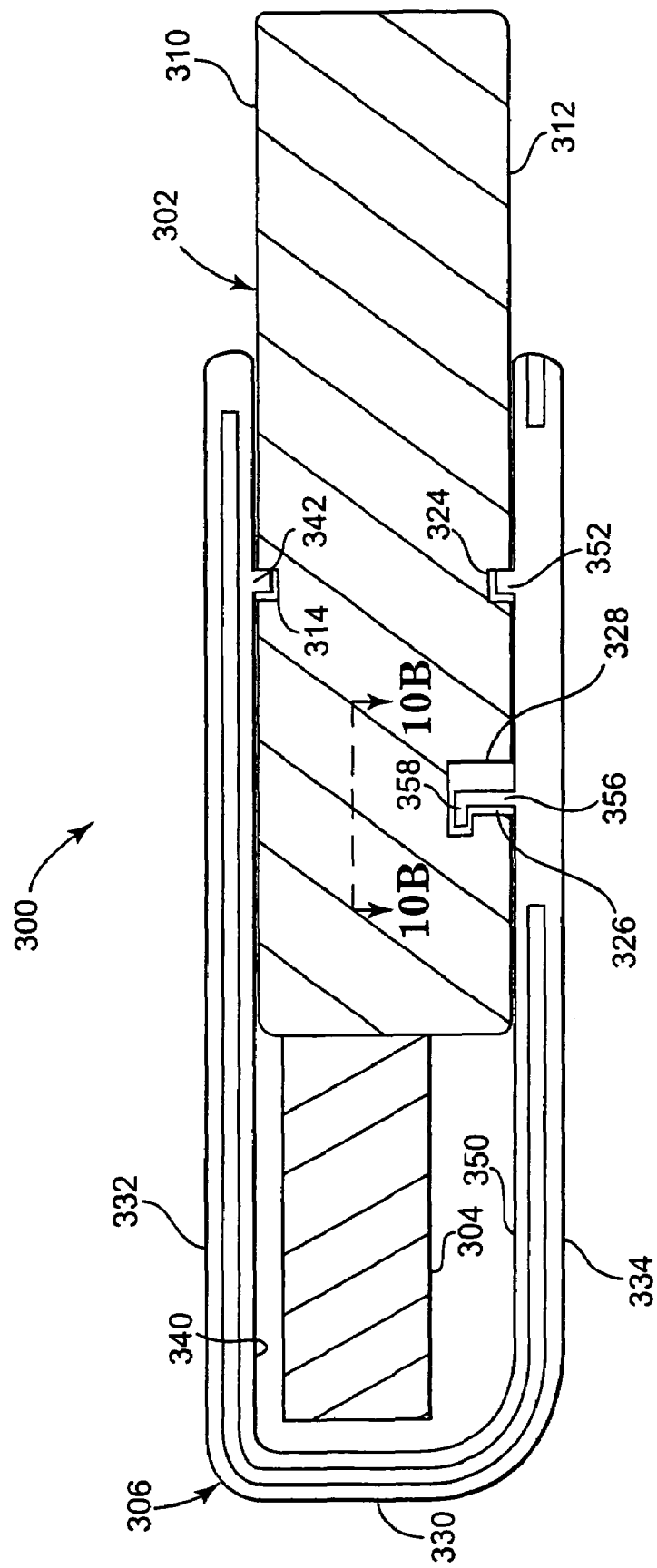
FIG. 10A illustrates an area cross-sectional view of another embodiment of a flash memory device including a swivel cap in a fully closed position according to the present invention.

FIG. 10A illustrates an area cross-sectional view of another embodiment of a flash memory device 300 according to one embodiment of the present invention. The flash memory device 300 includes a housing 302 enclosing a memory assembly (not shown), and a serial port 304 extending from the housing 302, and a swivel cap 306 rotatably coupled and removably attached to the housing 302.

The housing 302 defines a first face 310 and a second face 312. The first face 310 defines a recess 314, and the second face 312 defines a recess 324. In addition, the second face 312 defines a pivot hole 326 and a keyed channel 328 communicating with the pivot hole 326.

The swivel cap 306 defines a cap end 330, and a pair of opposing flanges 332, 334 cantilevered from the cap end 330. In this regard, the flange 332 defines an interior surface 340, and the flange 334 defines an interior surface 350. With this in mind, the interior surface 350 of the flange 334 defines a detent 352 and a pivot post 356 extending from the interior surface 350. The pivot post 356 terminates in a keyed head 358. In this regard, the keyed head 358 is captured in the pivot hole 326 such that the swivel cap 306 rotates about the housing 302.

As illustrated, the swivel cap 306 is in a closed position; rotation of the swivel cap by 180 degrees translates the swivel cap 306 to an open position. In this regard, the pivot post 356 and the keyed head 358 are configured to rotate within the pivot hole 326 between the open position and the closed position. In one embodiment, a conformation of the keyed head 358 corresponds with a conformation of the keyed channel 328 such that a removal position is defined for the swivel cap 306 relative to the housing 302.

In one embodiment, the removal position of the swivel cap 306 relative the housing 302 is offset by 90 degrees relative to the closed position. In another embodiment, a removal position for the swivel cap 306 relative to the housing 302 is offset from the closed position by 180 degrees. In yet another embodiment, a removal position for the swivel cap 306 relative to the housing 302 is offset from the closed position by approximately 270 degrees. In this manner, the swivel cap 306 is rotatable between the open and closed positions, and is rotatable to a selected removal position.

In one embodiment, a selective design of the geometry of the detents 342, 352 relative to the recesses 314, 324, respectively, creates a recoverable and elastic spring force between the swivel cap 306 and the housing 302. In this manner, only one pivot post, for example pivot post 356, is employed to provide a pivoting motion for the swivel cap 306 relative to the housing 302. Thus, by a combination of spring-like forces between the swivel cap 306 and the housing 302, in combination with the pivot post 356 and the keyed head 358, the swivel cap 306 is rotatably coupled and removably attached to the housing 302.

In one embodiment, a portion of the flange 332 is available as a clip, such that the flash memory device 300 can be clipped to a wearer's clothing or briefcase, or other object.

Figure 10B:
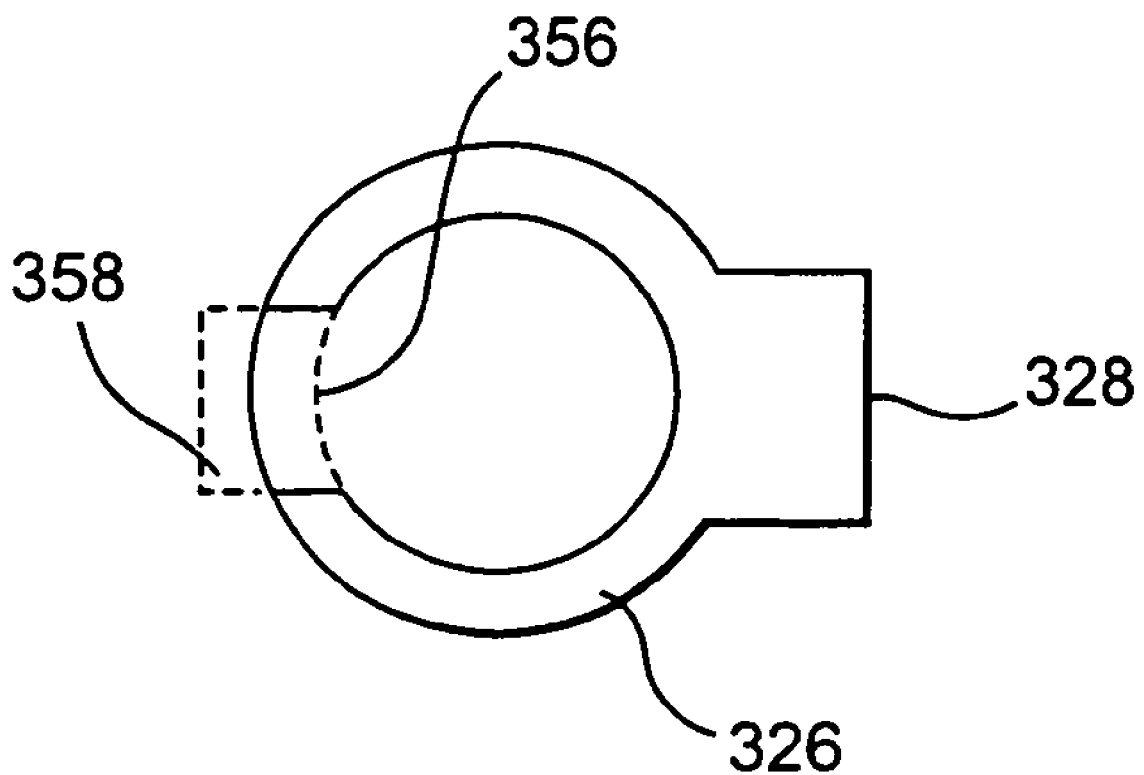
FIG. 10B illustrates a top planar view of a keyed head misaligned with a keyed channel for the flash memory device shown in FIG. 10A.

FIG. 10B illustrates a top planar view of the keyed head 358 misaligned with the keyed channel 328 for the flash memory device 300 shown in FIG. 10A. In this regard, the keyed head 358 includes a single key captured within the pivot hole 326 such that the swivel cap 306 cannot be removed from the housing 302.

Figure 11A:
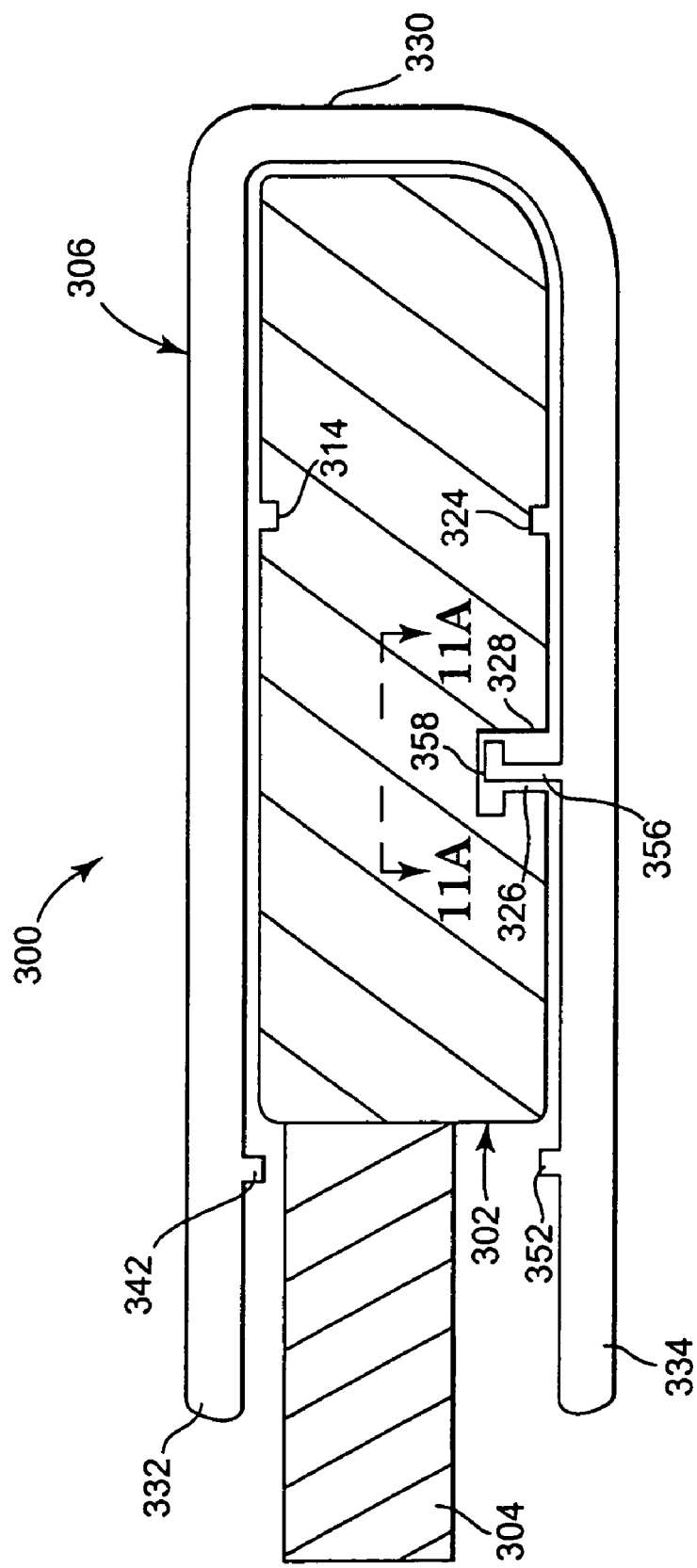
FIG. 11A illustrates an area cross-sectional view of the swivel cap illustrated in FIG. 10A in a fully open position.

FIG. 11A illustrates an area cross-sectional view of the flash memory device 300 with the swivel cap 306 in an open position. A rotational force has been applied to the swivel cap 306 sufficient to disengage the detents 342, 352 from the recesses 314, 324, respectively. In this regard, the rotational force has overcome the spring force of the "living spring" swivel cap 306. In the open position, the serial port 304 is exposed and readied for connection to a peripheral device. In one embodiment, the open position corresponds to a removal position of the swivel cap 306 relative to the housing 302.

For example, when the swivel cap 306 is rotated to the open position, in one embodiment the pivot post 356 and the keyed head 358 rotate along with the swivel cap 306 such that the keyed head 358 aligns with the keyed channel 328 of the pivot hole 326 (i.e., the swivel cap 306 is in the removal position, as illustrated). In this manner, the keyed head 358 is aligned with the keyed channel 328 and the flange 334 is configured for displacement away from the housing 302. Rotation of the swivel cap 306 to a removal position enables the swivel cap 306 to be removed (i.e., displaced) from the housing 302.

In one embodiment, the swivel cap occupies a removal position that is oriented in the fully open position. In another embodiment, the removal position is offset from the fully open position by 90 degrees (and therefore offset from the closed position by 90 degrees). In other embodiments, the removal position is different than the fully open position and the fully closed position. In any regard, an alignment of the keyed head 358 with the keyed channel 328 enables a removal of the swivel cap 306 from the housing 302.

Figure 11B:
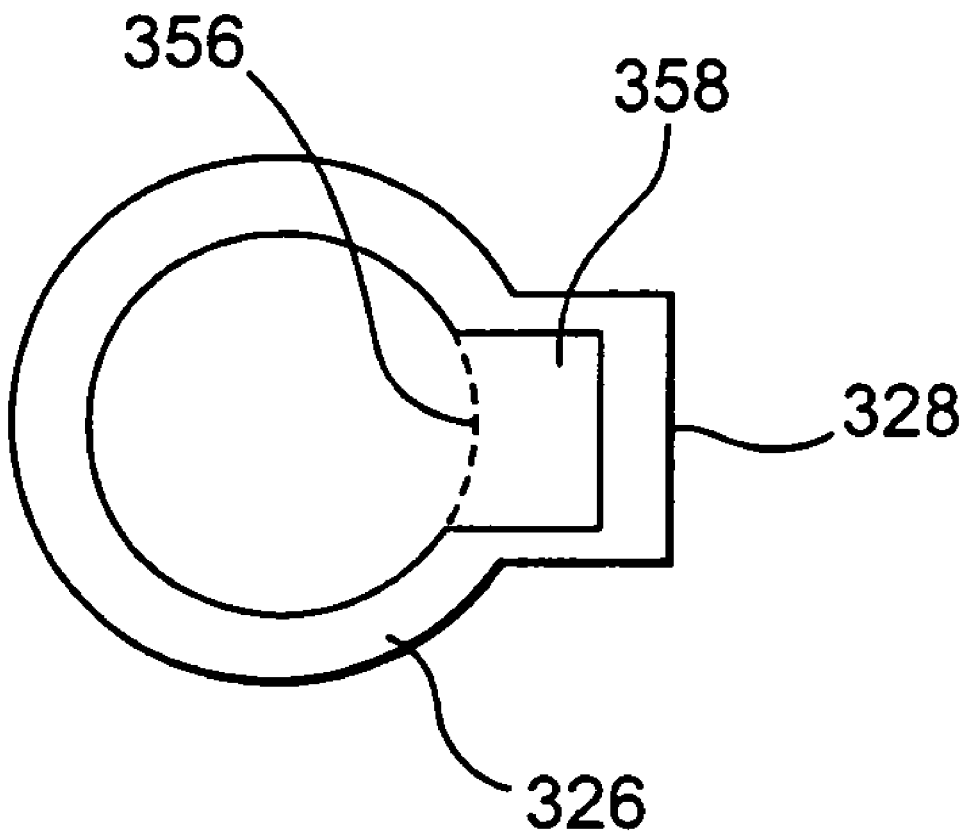
FIG. 11B illustrates a top planar view of a keyed head aligned with a keyed channel for the flash memory device shown in FIG. 11A.

FIG. 11B illustrates a top planar view of the keyed head 358 aligned with the keyed channel 328 for the flash memory device 300 shown in FIG. 11A. In this regard, the keyed head 358 includes a single key that is aligned with the keyed channel 328 such that the swivel cap 306 can be removed from the housing 302.

With additional reference to FIG. 6, in one embodiment the swivel cap 206 defines a pair of opposing pivot posts 246, 256 rotatable to an open position. In one embodiment, the swivel cap 206 defines a closed position (as illustrated in FIG. 6) and an open position wherein the swivel cap 206 is rotated 180 degrees from the closed position. In one embodiment, a removal position is defined by an alignment of the keyed heads 248, 258 relative to respective keyed channels 218, 228 such that the removal position is the same as the open position (i.e., rotated 180 degrees from the closed position). In another embodiment, the flange 232 defines a removal position (for example, 90 degrees from the closed position) that is different than a removal position of the flange 234 (for example, 270 degrees from the closed position). In this manner, in one embodiment each flange 232, 234 defines a different removal position different. In another embodiment, each flange 232, 234 defines a substantially identical removal position.

For example, in one embodiment the removal position for the flange 232 is oriented 90 degrees from the closed position such that the keyed head 248 aligns with the keyed channel 218 when the flange 232 is rotated 90 degrees from the closed position. In addition, in one embodiment the removal position for the flange 234 is different than the removal position for the flange 232. For example, in one embodiment the removal position for the flange 234 is oriented 270 degrees from the closed position. In particular, the removal position for the flange 234 is offset by 180 degrees from the removal position for the flange 232. In this manner, the keyed head 258 aligns with the keyed channel 228 when the flange 234 is rotated by 270 degrees from the closed position (and therefore 180 degrees from the removal position of the flange 232).

With additional reference to FIG. 6 and FIG. 7, in one embodiment the keyed head 258 defines a perimeter shape that is noncircular in lateral cross section. For example, and with reference to FIGS. 5A-5C, in one embodiment the keyed head 258 defines a perimeter geometry that is complimentary to one of the keyed channels 132, 152, or 172. In another embodiment, the keyed head 258 is circular in lateral cross section. In any regard, a perimeter geometry of the keyed head 258 is complimentary to and corresponds with a perimeter geometry of the keyed channel defined in the housing.

In one embodiment, a perimeter geometry of a first keyed head, for example keyed head 248 in FIG. 6, is different than a perimeter geometry of a second keyed head, for example, keyed head 258. Application of this embodiment, where a first keyed head defines a geometry different than a geometry of a second keyed head, is beneficially employed when a first flange, for example flange 232, defines a removal position that is different than a second flange, for example flange 234. In this manner, incorrect assembly of the swivel cap 206 relative to the housing 202 is prevented, since the keyed head 248 only fits into the pivot hole 216 (and not into the pivot hole 226), and conversely, the keyed head 258 fits only into the pivot hole 226 (and not into the pivot hole 216).

With this above mind, various geometries of the keyed heads have been described, such as perimeter geometries that are noncircular in lateral cross section, perimeter geometries that define equilateral triangles in lateral cross section, perimeter geometries of keyed heads that define non-equilateral triangles in lateral cross section, keyed heads that define one or more lobes in lateral cross section, and keyed heads that define a perimeter shape that is star shaped in lateral cross section.

With additional reference to FIG. 6, during use of the flash memory device 200, a method of removing the swivel cap 206 from the flash memory device 200 includes rotating the swivel cap 206 to a first removal position and removing a first flange 232 from a face 210 of the housing 202. The method of removing the swivel cap 206 from the flash memory device can also include rotating the swivel cap to a second removal position and removing a second flange 234 from a second face 212 of the housing 202. As described above, in one embodiment the first removal position is oriented equal to the second removal position, and the first and second removal positions are offset from the closed position of the swivel cap relative to the housing 202 by approximately 180 degrees.

Various embodiments of a swivel cap rotatably disposed and removably attached to a housing of a flash memory device have been disclosed. Although specific embodiments have been illustrated and described herein, it will be appreciated by those of ordinary skill in the art that a wide variety of alternate and/or equivalent implementations calculated to achieve the same purposes maybe substituted for the specific embodiments shown and described without departing from the scope of the present invention. Those with skill in the chemical, mechanical, electro-mechanical, electrical, and computer arts will readily appreciate that the present invention may be implemented in a wide variety of embodiments. This application is intended to cover any adaptations or variations of the embodiments discussed herein. Therefore, it is manifestly intended that this invention be limited only by the claims and the equivalents thereof.

What is claimed is:

1. A flash memory device comprising:
   a housing enclosing a memory assembly;
   a serial port extending from the housing and coupled to the memory assembly; and
   a swivel cap rotatably coupled and removably attached to the housing, one of the cap and the housing defining a channel and an other of the cap and the housing comprising a post and a head connected to the post, the head movable through the channel and wider than the post;
   wherein the swivel cap is rotatable between a closed position covering the serial port and an open position exposing the serial port, and further wherein the swivel cap is rotatable to at least one removal position in which the head aligns with the channel to enable a separation of the swivel cap from the housing.

2. The flash memory device of claim 1, wherein the housing defines opposing faces extending between opposing sides and a base end opposite a port end, and at least one of the opposing faces defines a pivot hole and a keyed channel communicating with the pivot hole, and further wherein the swivel cap defines a pair of opposing flanges cantilevered from a cap end and a pivot post extending from an interior surface of at least one of the opposing flanges, the at least one pivot post terminating in a keyed head, the keyed head configured for capture in the pivot hole such that the swivel cap is rotatably coupled to the housing.

3. The flash memory device of claim 2, wherein a first face of the housing defines a first pivot hole defining a first keyed channel, and a second face of the housing defines a second pivot hole defining a second keyed channel, and further wherein the keyed heads of the swivel cap align with respective first and second keyed channels in the removal position.

4. The flash memory device of claim 3, wherein the swivel cap open position is oriented 180 degrees relative to the closed position, and further wherein the keyed heads of the swivel cap align with respective first and second keyed channels such that the removal position is the swivel cap open position.

5. The flash memory device of claim 3, wherein the swivel cap open position is oriented 180 degrees relative to the closed position, and further wherein a first keyed head of the swivel cap aligns with the first keyed channel when the swivel cap is oriented in a first removal position located between the closed and open positions.

6. The flash memory device of claim 5, wherein the first removal position is oriented approximately 90 degrees relative to the closed position.

7. The flash memory device of claim 5, wherein a second keyed head of the swivel cap aligns with the second keyed channel when the swivel cap is in a second removal position oriented approximately 180 degrees relative to the first removal position.

8. The flash memory device of claim 7, wherein the second removal position is oriented approximately 270 degrees relative to the open position.

9. The flash memory device of claim 2, wherein at least one of the flanges defines a detent and the housing further defines at least one recess sized to receive the detent.

10. The flash memory device of claim 9, wherein the detent is resistively maintained within the recess to selectively tension the swivel cap in the closed position.

11. A swivel cap removably attachable to a flash memory device housing for selectively exposing and covering a serial port of the flash memory device, the swivel cap comprising:
   a cap end;
   a pair of opposing flanges cantilevered from the cap end; and
   a pivot post extending from an interior surface of each of the opposing flanges, each pivot post terminating in a keyed head that is wider than the pivot post;
   wherein the keyed head is rotatable between a secured position in which the keyed head is configured to prevent removal of the swivel cap from the device housing and a removal position in which the keyed head is configured to enable removal of the swivel cap from the device housing.

12. The swivel cap of claim 11, wherein at least one keyed head is circular in lateral cross-section.

13. The swivel cap of claim 11, wherein a first keyed head defines a perimeter shape different from a perimeter shape of a second keyed head.

14. The swivel cap of claim 11, wherein the keyed heads are non-circular in lateral cross-section.

15. The swivel cap of claim 14, wherein the non-circular keyed heads define non-equilateral triangles in lateral cross-section.

16. The swivel cap of claim 14, wherein the non-circular keyed heads define a plurality of lobes in lateral cross-section.

17. A method of removing a cap from a flash memory device, the method comprising:
   providing a flash memory device including a housing and a rotatable swivel cap coupled to opposing pivot holes of the housing one of the rotatable swivel cap and the housing defining a channel and an other of the rotatable swivel cap and the housing comprising a post and head connected to the post, the head movable through the channel and wider than the post;
   rotating the swivel cap to a first removal position, aligning a first head with a first channel, and removing a first swivel cap flange from the housing; and
   rotating the swivel cap to a second removal position aligning a second head with a second channel, and removing a last swivel cap flange from the housing.

18. The method of claim 17, wherein rotating the swivel cap to a first removal position includes:
   rotating a first flange of the swivel cap to the first removal position, the first flange including a pivot post terminating in a keyed head, the pivot post extending from an interior surface of the first flange; and
   aligning the keyed head with a keyed channel of a first pivot hole in the housing.

19. The method of claim 17, wherein rotating the swivel cap to a second removal position includes:
   rotating a second flange of the swivel cap to the second removal position, the second flange including a pivot post terminating in a keyed head, the pivot post extending from an interior surface of the second flange; and
   aligning the keyed head with a keyed channel of a second pivot hole in the housing.

20. The method of claim 17, wherein the swivel cap is rotatable between a closed position covering the flash memory device and an open position exposing the flash memory device, and further wherein the first removal position and the second removal position are equal and correspond with the swivel cap open position.

21. The method of claim 17, wherein the swivel cap is rotatable between a closed position covering the flash memory device and an open position exposing the flash memory device, and further wherein the first removal position and the second removal position are not equal.

22. A flash memory device comprising:
   a housing enclosing a memory assembly;
   a serial port extending from the housing and coupled to the memory assembly; and
   a swivel cap rotatably coupled and removably attached to the housing, swivel cap comprising a pair of opposing flanges cantilevered from a cap end and first and second keyed pivot posts extending from a respective interior surface of each of the opposing flanges, each keyed pivot post comprising a head extending laterally wider than the pivot post that is rotatably and removably captured in a keyed pivot hole formed in the housing;
   wherein the swivel cap is rotatable between a closed position covering the serial port and an open position exposing the serial port, the swivel cap comprising:
      a first removal position in which a first keyed head of the first pivot post aligns with its keyed pivot hole to enable a first of the opposing flanges to separate from the housing;
      a second removal position in which a second keyed head of the second pivot post aligns with its keyed pivot hole to enable a second of the opposing flanges to separate from the housing.

23. The flash memory device of claim 22, wherein the fist removal position is different from the second removal position.

24. The flash memory device of claim 22, wherein one of the first removal position and the second removal position corresponds with the open position of the swivel cap exposing the serial port.

25. The flash memory device of claim 22, wherein neither of the first removal position and the second removal position corresponds with the open position of the swivel cap exposing the serial port.

26. A flash memory device comprising:
   a housing enclosing a memory assembly;
   a serial port extending from the housing and coupled to the memory assembly; and
   a cap removable from the housing, the cap comprising first and second opposed flanges cantilevered from a cap end, one of the cap and the housing defining first and second channels and an other of the cap and the housing comprising first and second posts, each post captured in a respective one of the first and second channels;
   wherein the first flange of the swivel cap is rotatable relative to the housing to a first position in which the first post is removable from the first channel and the second flange of the swivel cap is rotatable relative to the housing to a second position in which the second post is removable from the second channel, the second position different from the first position.

* * * * *

UNITED STATES PATENT AND TRADEMARK OFFICE
CERTIFICATE OF CORRECTION

PATENT NO. : 7,549,875 B2  Page 1 of 1
APPLICATION NO. : 11/229358
DATED : June 23, 2009
INVENTOR(S) : G. Phillip Rambosek et al.

It is certified that error appears in the above-identified patent and that said Letters Patent is hereby corrected as shown below:

Column 11
    Line 35, "housing one" should read --housing, one--.
    Line 43, "position align-" should read --position, align- --.

Column 12
    Line 15, "housing, swivel cap" should read --housing, the swivel cap--.
    Line 33, "fist" should read --first--.

Signed and Sealed this

Twenty-second Day of September, 2009

David J. Kappos
*Director of the United States Patent and Trademark Office*